(12) United States Patent
    Lee

(10) Patent No.: US 12,566,061 B2
(45) Date of Patent: Mar. 3, 2026

(54) SYSTEMS AND METHODS FOR INSPECTING PHOTOMASKS

(71) Applicant: The Texas A&M University System, College Station, TX (US)

(72) Inventor: ChaBum Lee, College Station, TX (US)

(73) Assignee: The Texas A&M University System, College Station, TX (US)

( * ) Notice: Subject to any disclaimer, the term of this patent is extended or adjusted under 35 U.S.C. 154(b) by 395 days.

(21) Appl. No.: 18/074,066

(22) Filed: Dec. 2, 2022

(65) Prior Publication Data

US 2023/0175839 A1 Jun. 8, 2023

Related U.S. Application Data

(60) Provisional application No. 63/285,619, filed on Dec. 3, 2021.

(51) Int. Cl.
    *G01B 11/24* (2006.01)
    *G01B 11/25* (2006.01)
    *G03F 1/84* (2012.01)

(52) U.S. Cl.
    CPC ...... *G01B 11/2441* (2013.01); *G01B 11/2518* (2013.01); *G03F 1/84* (2013.01)

(58) Field of Classification Search
    CPC . G01B 11/2441; G01B 11/2518; G01B 11/25; G03F 1/84
    USPC ........ 356/603, 511, 515, 495, 605, 124, 358
    See application file for complete search history.

(56) References Cited

U.S. PATENT DOCUMENTS

| | | | | |
|---|---|---|---|---|
| 3,943,278 A | * | 3/1976 | Ramsey, Jr. ......... | G01B 11/254 |
| | | | | 348/130 |
| 4,525,858 A | * | 6/1985 | Cline ..................... | G01B 11/25 |
| | | | | 345/426 |
| 6,011,624 A | * | 1/2000 | de Groot .............. | G01B 11/303 |
| | | | | 356/511 |
| 6,078,393 A | * | 6/2000 | Oohashi ............. | G01B 9/02024 |
| | | | | 356/511 |
| 7,242,464 B2 | * | 7/2007 | Hansen ................... | G03F 7/706 |
| | | | | 356/124 |
| 2002/0001759 A1 | * | 1/2002 | Ohashi ................ | G03F 7/70058 |
| | | | | 430/5 |
| 2002/0021434 A1 | * | 2/2002 | Nomura .................. | G03F 7/706 |
| | | | | 430/30 |
| 2003/0137655 A1 | * | 7/2003 | Wegmann .......... | G01M 11/0285 |
| | | | | 356/124 |
| 2006/0001861 A1 | * | 1/2006 | Wegmann ............... | G03F 7/706 |
| | | | | 356/124 |
| 2008/0062427 A1 | * | 3/2008 | Ohsaki .............. | G02B 27/0025 |
| | | | | 356/491 |
| 2009/0021748 A1 | * | 1/2009 | Latypov .................. | G03F 7/706 |
| | | | | 356/520 |
| 2011/0134408 A1 | * | 6/2011 | Kuramoto .......... | G01M 11/0264 |
| | | | | 355/77 |

(Continued)

*Primary Examiner* — Isiaka O Akanbi
(74) *Attorney, Agent, or Firm* — Conley Rose, P.C.

(57) ABSTRACT

A method for inspecting a photomask includes scanning the photomask with an interferometric fringe pattern generated by an interferometer, generating an interferogram associated with the photomask in response to scanning the photomask using the interferometer, and detecting one or more geometric parameters of the photomask using the generated interferogram.

20 Claims, 9 Drawing Sheets

(56)          References Cited

U.S. PATENT DOCUMENTS

2015/0204729 A1*  7/2015  Kusunose ................. G03F 1/84
                                                        356/521
2019/0163132 A1*  5/2019  Sung .................... G03H 1/0443
2021/0026250 A1*  1/2021  Tang ...................... G03F 7/706

* cited by examiner

200

202
Scan the photomask with an interferometric fringe pattern generated by an interferometer.

204
Generate an interferogram associated with the photomask in response to scanning the photomask using the interferometer.

206
Detect one or more geometric parameters of the photomask using the generated interferogram.

SYSTEMS AND METHODS FOR INSPECTING PHOTOMASKS

CROSS-REFERENCE TO RELATED APPLICATIONS

This application claims benefit of U.S. provisional patent application Ser. No. 63/285,619 filed Dec. 3, 2021, and entitled "Systems and Methods for Inspecting Photomasks," which is hereby incorporated herein by reference in its entirety for all purposes.

STATEMENT REGARDING FEDERALLY SPONSORED RESEARCH OR DEVELOPMENT

Not applicable.

BACKGROUND

Photomasks are opaque patterned substrates utilized, among other things, in the production of integrated circuits via a photolithography process. A photomask may be used to project a pattern defined by the photomask onto a substrate such as a silicon wafer and the like. The initial pattern may be computer generated and formed onto an initially blank photomask (referred to as a "mask blank") using a lithography process in which a replication of the computer-generated pattern is developed onto a resist-coated surface of the mask blank to form the photomask. Particularly, the resist image formed on the photomask acts as a mask and the pattern is transferred onto the photomask once the resist layer has been removed. Several photomasks may be used together as a mask set for producing multiple patterned layers onto the substrate.

BRIEF SUMMARY OF THE DISCLOSURE

An embodiment of a method for inspecting a photomask comprises (a) scanning the photomask with an interferometric fringe pattern generated by an interferometer, (b) generating an interferogram associated with the photomask in response to scanning the photomask using the interferometer, and (c) detecting one or more geometric parameters of the photomask using the generated interferogram. In some embodiments, (c) comprises (c1) comparing the generated interferogram with a reference interferogram. In some embodiments, the generated interferogram is associated with a fabricated pattern of the photomask, and the reference interferogram is associated with an intended pattern of the photomask. In certain embodiments, (c1) comprises performing a cross-correlation analysis between the generated interferogram and the reference interferogram. In certain embodiments, (a) comprises (a1) shaping a collimated beam using an objective lens of the interferometer to focus an incident beam on a focal point. In some embodiments, (b) comprises (b1) superpositioning a reference incident spherical wave and an edge-diffracted wave. In some embodiments, the one or more geometric parameters comprise at least one of a pattern width, an opening area width, a line-edge quality, and an opening area surface quality of the photomask. In certain embodiments, (c) comprises (c1) performing at least one of fringe analysis method and a wavelet-based feature extraction method on the interferogram.

An embodiment of a system for inspecting a photomask comprises an interferometer comprising a laser configured to generate a beam and a photodetector configured to detect the beam generated by the laser, the interferometer configured to generate an interferometric fringe pattern and to scan the photomask with the interferometric fringe pattern, and a computer system in signal communication with the interferometer, the computer system configured to generate an interferogram associated with the photomask based on data provided by the photodetector, and to detect one or more geometric parameters of the photomask using the generated interferogram. In some embodiments, the interferometer comprises an objective lens positioned between the laser and the photodetector along a beam axis of the interferometer. In some embodiments, the system comprises a motion stage coupled to the interferometer, the motion stage comprising an actuator configured to transport the photomask along a motion axis extending orthogonal to a beam axis of the interferometer. In certain embodiments, the motion axis comprises a first motion axis and the actuator is configured to transport the photomask along a second motion axis extending orthogonal to the first motion axis. In some embodiments, the computer system is configured to compare the generated interferogram with a reference interferogram. In some embodiments, the generated interferogram is associated with a fabricated pattern of the photomask, and the reference interferogram is associated with an intended pattern of the photomask. In certain embodiments, the one or more geometric parameters comprise at least one of a pattern width, an opening area width, a line-edge quality, and an opening area surface quality of the photomask.

An embodiment of a computer system for inspecting a photomask comprises a processor, and a storage device coupled to the processor and containing instructions that when executed cause the processor to scan the photomask with an interferometric fringe pattern generated by an interferometer, generate an interferogram associated with the photomask in response to scanning the photomask using the interferometer, and detect one or more geometric parameters of the photomask using the generated interferogram. In some embodiments, the instructions when executed cause the processor to compare the generated interferogram with a reference interferogram. In some embodiments, the generated interferogram is associated with a fabricated pattern of the photomask, and the reference interferogram is associated with an intended pattern of the photomask. In certain embodiments, the instructions when executed cause the processor to perform a cross-correlation analysis between the generated interferogram and a reference interferogram. In some embodiments, the one or more geometric parameters comprise at least one of a pattern width, an opening area width, a line-edge quality, and an opening area surface quality of the photomask.

BRIEF DESCRIPTION OF THE DRAWINGS

For a detailed description of exemplary embodiments of the disclosure, reference will now be made to the accompanying drawings in which.

DETAILED DESCRIPTION

Figure 1:
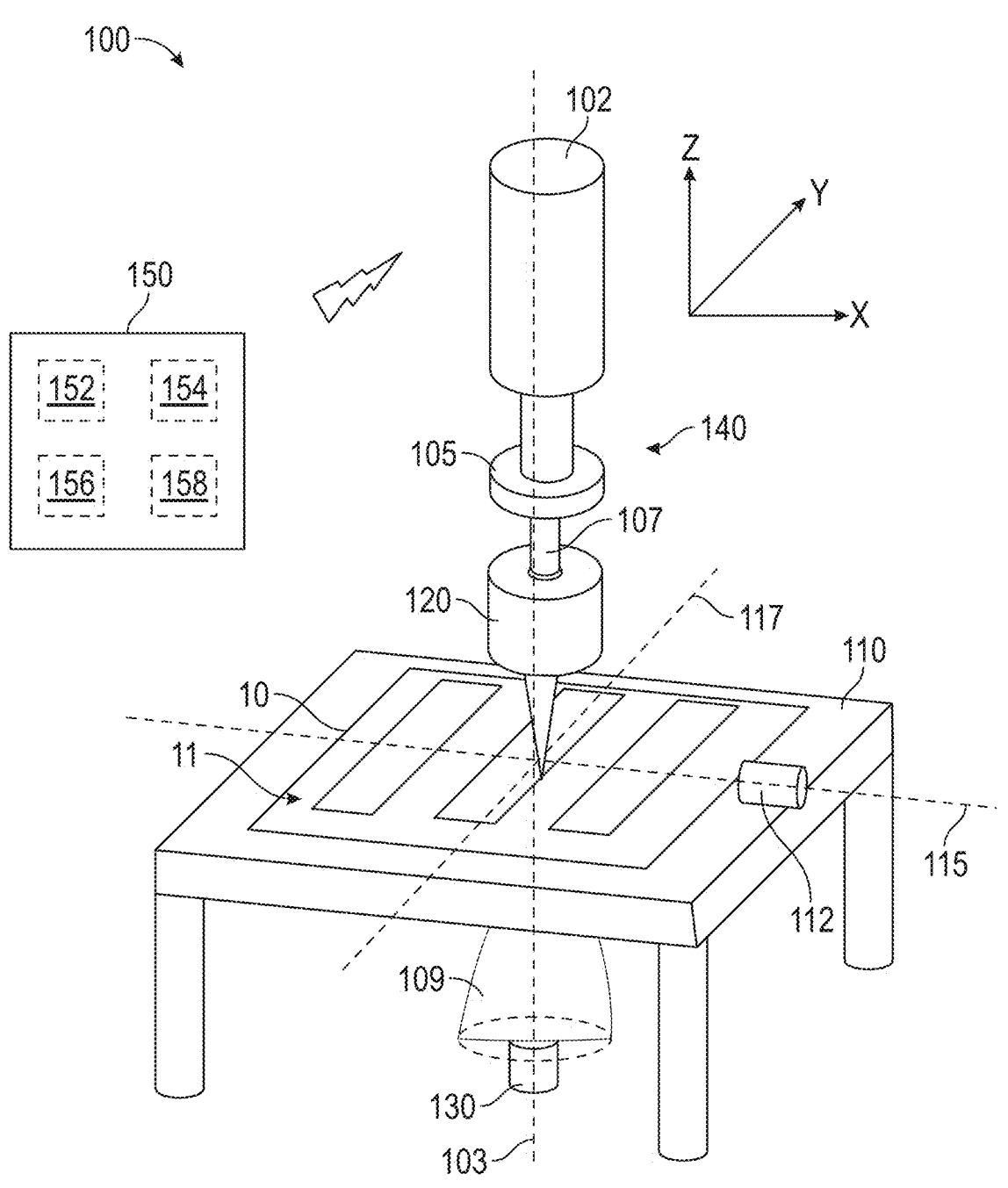
FIG. 1 is a schematic view of an embodiment of a photomask inspection system.

The following discussion is directed to various exemplary embodiments. However, one skilled in the art will understand that the examples disclosed herein have broad application, and that the discussion of any embodiment is meant only to be exemplary of that embodiment, and not intended to suggest that the scope of the disclosure, including the claims, is limited to that embodiment.

Certain terms are used throughout the following description and claims to refer to particular features or components. As one skilled in the art will appreciate, different persons may refer to the same feature or component by different names. This document does not intend to distinguish between components or features that differ in name but not function. The drawing figures are not necessarily to scale. Certain features and components herein may be shown exaggerated in scale or in somewhat schematic form and some details of conventional elements may not be shown in interest of clarity and conciseness.

In the following discussion and in the claims, the terms "including" and "comprising" are used in an open-ended fashion, and thus should be interpreted to mean "including, but not limited to . . . " Also, the term "couple" or "couples" is intended to mean either an indirect or direct connection. Thus, if a first device couples to a second device, that connection may be through a direct connection, or through an indirect connection via other devices, components, and connections. In addition, as used herein, the terms "axial" and "axially" generally mean along or parallel to a central axis (e.g., central axis of a body or a port), while the terms "radial" and "radially" generally mean perpendicular to the central axis. For instance, an axial distance refers to a distance measured along or parallel to the central axis, and a radial distance means a distance measured perpendicular to the central axis. As used herein, the terms "approximately," "about," "substantially," and the like mean within 10% (i.e., plus or minus 10%) of the recited value. Thus, for example, a recited angle of "about 80 degrees" refers to an angle ranging from 72 degrees to 88 degrees.

As described above, photomasks are opaque patterned substrates utilized in the production of semiconductor devices via a photolithography process. Additionally, certain geometric parameters of the photomask such as, for example, line edge roughness (LER), and others may be critical for the performance of the photomask in accurately and precisely producing semiconductor devices. Conventionally, completed photomasks are typically inspected using scanning electron microscopy (SEM) and other conventional advanced measurement systems. Defects in the photomask may include damaged or unwanted patterns such as the formed pattern being smaller or larger than the intended pattern. Additionally, the formed pattern may have a LER that reduces printability of the pattern due to excessive light scattering at the edges of the pattern.

Mitigating the issues identified above (e.g., damaged patterns, LER) through a robust photomask inspection metrology is essential in ensuring adequate performance of the photomask in fabricating semiconductor or other devices. Moreover, new techniques such as extreme ultraviolet (EUV) lithography has enabled high volume fabrication of photomasks, heightening the need for fast and accurate photomask inspection techniques. However, conventional techniques such as SEM-based and other microscopy-based techniques are generally inconvenient, labor and time intensive, and too expensive for wide application beyond in-process inspection.

Accordingly, embodiments of systems and associated methods for inspecting photomasks are disclosed herein in which photomasks are inspected using utilizing knife-edge interferometry. Particularly, methods of inspecting photomasks are described herein which include scanning the photomask with an interferometric fringe pattern generated by an interferometer, generating an interferogram associated with the photomask in response to scanning the photomask using the interferometer, and detecting one or more geometric parameters of the photomask using the generated interferogram. Additionally, photomask inspections systems are described herein which include an interferometer comprising a laser configured to generate a beam and a photodetector configured to detect the beam generated by the laser, the interferometer configured to generate an interferometric fringe pattern and to scan the photomask with the interferometric fringe pattern, and a computer system in signal communication with the interferometer, the computer system configured to generate an interferogram associated with the photomask based on data provided by the photodetector, and to detect one or more geometric parameters of the photomask using the generated interferogram. The disclosed systems and methods permit for the rapid and convenient inspection photomasks requiring a minimal amount of time and labor compared with conventional techniques, allowing for inspection of the photomask to occur during fabrication by the manufacturer or afterwards by the end-user.

Figure 2:
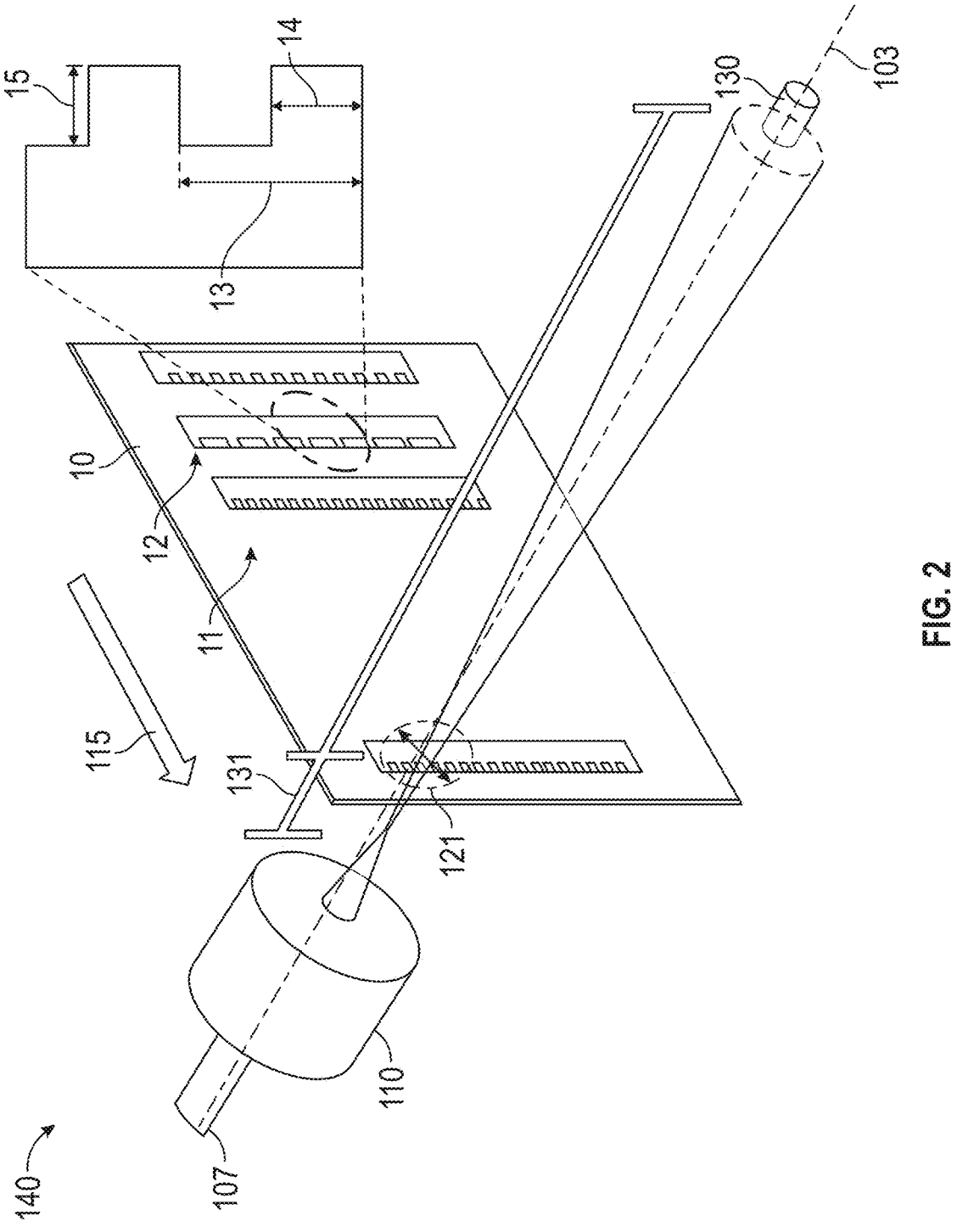
FIG. 2 is a schematic view of an embodiment of an interferometer of the photomask inspection system of FIG. 1.
Figure 3:
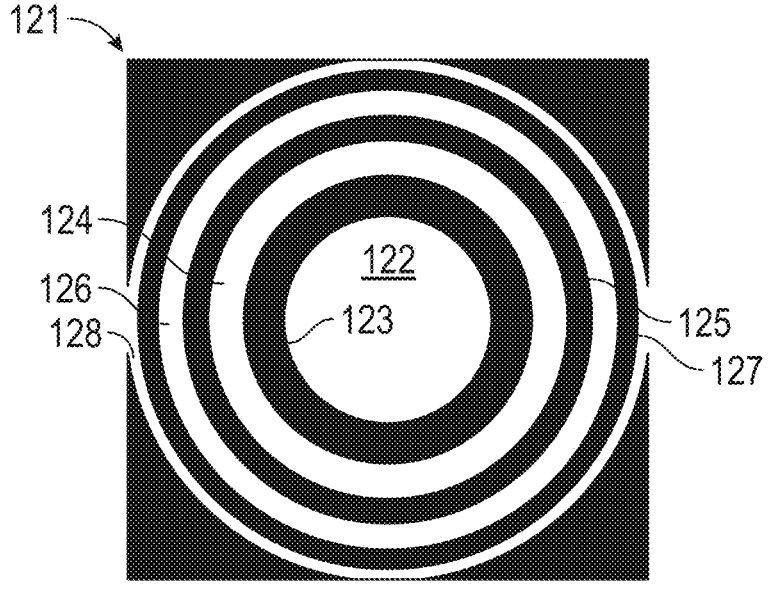
FIG. 3 is a front view of an interferometric fringe pattern producible by the interferometer of FIG. 2.

Referring now to FIGS. 1-3, an embodiment of a photomask inspection system 100 is shown. As will be discussed further herein, photomask inspection system 100 utilizes knife edge interferometry (EKEI) to identify one or more geometric parameters of a pattern (generally identified by arrow 11 in FIGS. 1 and 2) of a photomask 10 scanned by the photomask inspection system 100. Geometric parameters of the photomask include a pattern width, an opening area width, a line-edge quality, and an opening area surface quality of the photomask. In some instances, the photomask inspection system 100 may identify abnormalities or defects in the pattern 11 such as voids, scratches, residual photoresist, or dust, and other geometric parameters of the pattern 11 such as the LER of the pattern 11. In this example, the pattern 11 of photomask 10 includes a geometric feature 12 having a LER defined by a period 13, a depth 14, and an intensity 15. Not intending to be bound by any particular theory, in this example, the LER of geometric feature 12 may be defined in accordance with Equation (1) below, where (P) represents the period of the LER (e.g., period 13 shown in FIG. 2), (D) represents the depth of the LER (e.g., depth 14 shown in FIG. 2), and (I) represents the intensity of the LER (e.g., intensity 15 shown in FIG. 2):

$$LER = 3 \times I \sqrt{\frac{D}{P} \times \left(1 - \frac{D}{P}\right)} \qquad (1)$$

It may be understood that the Equation (1) only represents an exemplary technique for defining the LER of a geometric feature of a photomask pattern, and that LER may be determined differently in other embodiments. Additionally, it may be understood that photomask 10 and its associated pattern 11 are only exemplary and nonlimiting. The types of photomasks and the configuration of their respective patterns (as well as the geometric parameters associated with the patterns identifiable by system 100) may vary in other embodiments.

In this exemplary embodiment, photomask inspection system 100 generally includes a light source or laser 102, a motorized stage 110, an objective lens 120, a photodetector 130, and a controller or controller 150. The configuration of laser 102 may vary substantially depending on the given application, and in this exemplary embodiment is configured to generate a laser beam having a wavelength between approximately 200 nanometers (nm) and 800 nm; however, the wavelength producible by laser 102 may of course vary in other embodiments. The beam produced by laser 102 passes through an annular aperture 105 spaced from the laser 102 along a beam axis 103 (extending in the "Z" direction in FIG. 1, thereby forming a collimated beam 107 that extends from aperture 105 along the beam axis 103. In this exemplary embodiment, aperture 105 is approximately 1.0 millimeters (mm) in diameter; however, it may be understood that the diameter of aperture 105 may vary in other embodiments. Indeed, in certain embodiments, photomask inspection system 100 may not include aperture 105.

The photomask 10 is positionable on the motorized stage 110 where stage 110 comprises a motor or actuator 112 (indicated schematically in FIG. 1) for transporting photomask 10 relative to the stage 110 and beam axis 103 along a motion axis 115. In this exemplary embodiment, motion axis 115 extends orthogonally to the beam axis 103, extending in the "X" direction in FIG. 1. It may be understood that the operation of actuator 112 may be controlled by the controller 150 of photomask inspection system 100. For example, controller 150 may cause the photomask 10 to travel along motion axis 115 at a predefined speed whereby the photomask 10 passes completely across the beam axis 103 of system 100.

Additionally, in some embodiments, actuator 112 may also cause photomask 10 to travel along a secondary motion axis 117 (motion axis 115 comprising a primary motion axis 115) oriented orthogonal to both the primary motion axis 115 and the beam axis 103 and extending in the "Y" direction in FIG. 1. For example, after the photomask 10 makes a single pass moving along the primary motion axis 115, actuator 112 may move the photomask 10 along the secondary motion axis 117 a fixed increment that is less than the length of the photomask 10 (the dimension of photomask 10 extending along the secondary motion axis 117). After moving the increment along the secondary motion axis 117, the actuator 112 may cause the photomask 10 to make a second pass across the entire width of the photomask 10 (the dimension of photomask 10 extending along primary motion axis 115) along the primary motion axis 115. This process may be repeated until the entire pattern 11 of photomask 10 has been scanned by the photomask inspection system 100. In this manner, motion stage 110 is configured to adjust the relative position of photomask 10 with respect to beam axis 103 to allow for the complete scanning of pattern 11 of photomask 10 by photomask inspection system 100.

The objective lens 120 is positioned, with laser 102 and aperture 105, along the beam axis 103 in a position located between the aperture 105 and photodetector 130. The laser 102, objective lens 120, and photodetector 130 may be collectively referred to as an interferometer 140 of the inspection system 100. In some embodiments, computer system 150 may also comprise a component of the interferometer. In this exemplary embodiment, objective lens 120 has a numerical aperture (NA) of approximately between 0.2 and 0.8 (e.g., 0.4); however, it may be understood that the NA of objective lens 120 may vary in other embodiments. For example, the NA of objective lens 120 may be selected based on the size or geometry of the given photomask inspected by the photomask inspection system 100. Objective lens 120 shapes the collimated beam 107 into a spherical waveform 109 that incidents against or contacts the photomask 10 as the photomask 10 is transported along the primary motion axis 115 by the actuator 112 of motion stage 110.

The photodetector 130 of photomask inspection system 100 is positioned along beam axis 103 on the opposite side of photomask 10 from laser 102, aperture 105, and objective lens 120. Photodetector 130 receives the laser light generated by laser 102 and diffracted against the photomask 10. In some embodiments, photodetector 130 comprises a single photodiode or array type photodiode such as a charge-coupled device (CCD) or a complementary metal-oxide-semiconductor (CMOS). The laser light sensed or detected by photodetector 130 may be recorded by controller 150 (in signal communication with photodetector 130) a received or output intensity over time.

In this exemplary embodiment, controller 150 comprises a computer or computing system including a processor 152, memory or storage device 154, one or more input/output (I/O) devices 156, and a communications device 158. The communication device 158 of controller 150 may be a wireless or wired communication device that may facilitate communication between the controller 150 and one or more other components of photomask inspection system 100 including, for example, laser 102, actuator 112 of motion stage 110, photodetector 130, as well as other devices The processor 152 of controller 150 may execute instructions stored on the memory 154 thereof to control the operation of various components of photomask inspection system 100.

The processor 152 of controller 150 may be any type of computer processor or microprocessor capable of executing computer-executable code. The processor 152 may also include multiple processors that may perform the operations described below. The memory 154 of controller 150 may be any suitable articles of manufacture that can serve as media to store processor-executable code, data, or the like. These articles of manufacture may represent computer-readable media (e.g., any suitable form of memory or storage) that may store the processor-executable code used by the processor 152 to perform the presently disclosed processes. Generally, the processor 152 of controller 150 may execute software applications that include programs that automate the operation of photomask inspection system 100.

The memory 154 of controller 150 may also be used to store the data, analysis of the data, the software applications, and the like. The memory 154 of controller 150 may represent non-transitory computer-readable media (e.g., any suitable form of memory or storage) that may store the processor-executable code used by the processor 152 of controller 150 to perform various techniques described herein. It should be noted that non-transitory merely indicates that the media is tangible and not a signal. Additionally, the I/O devices 156 of controller 150 may be interfaces that may couple to other peripheral components such as input devices (e.g., keyboard, mouse), sensors, displays, input/output (I/O) modules, and the like. I/O devices 156 of controller 150 may enable controller 150 to communicate with the other computing devices of the photomask inspection system 100.

With the foregoing in mind, the present techniques described herein may also be performed using a controller 150 that employs multiple computer systems, a cloud-based computer system, or the like to distribute processes to be performed across multiple computer systems. In this case, each computer system operating as part of a supercomputer may not include each component listed as part of the controller 150.

The spherical waveform 109 formed by objective lens 120 may form a Fresnel zone on an obstruction (e.g., photomask) that is positioned to at least partially intersect the spherical waveform 109. Resulting from the superposition of the reference incident spherical waveform 109 and an edge-diffracted wave as the photomask 10 is scanned, the Fresnel zone defines an interferometric fringe pattern including one or more half-period zones depending on the Fresnel number (F) of the given Fresnel zone. In this exemplary embodiment, the Fresnel zone defines an interferometric fringe pattern 121 (shown specifically in FIG. 3) having a central high intensity region 122 surrounded by alternating annular or ring-shaped low intensity regions 123, 125, and 127 and annular or ring-shaped high intensity regions 124, 126, and 128, respectively. The high intensity regions 122, 124, 126, and 128 of interferometric fringe pattern 121 correspond to the odd term of the Fresnel zone having a constructive contribution to the interference with the obstruction while low intensity regions 123, 125, and 127 correspond to the even term of the Fresnel zone having a destructive contribution to the interference with the obstruction.

It may be understood that the interferometric fringe pattern 121 formed by spherical waveform 109 may be modeled or simulated by the controller 150 of photomask inspection system 100. Particularly, the interferometric fringe pattern 121 formed from the spherical waveform 109 intersecting an obstruction having an edge with varying degrees of LER, including zero roughness (LER=0), may be simulated by controller 150. In some embodiments, controller 150 may simulate the interferometric fringe pattern 121 using a Fresnel number-based computation model. Not intending to be bound by any particular theory, the Fresnel number-based computation model may be based on Equation (2) as follows, where (F) represents the Fresnel number, (NA) represents the numerical aperture of the objective lens (e.g., the NA of objective lens 120), (λ) represents the light wavelength (e.g., the wavelength of the light comprising waveform 109), (Z_src) represents the distance between the objective lens focal point and the photomask pattern along the beam axis (e.g., along beam axis 103)

$$F = \frac{NA^2 \times Z_{src}}{\lambda} \qquad (2)$$

Figure 4:
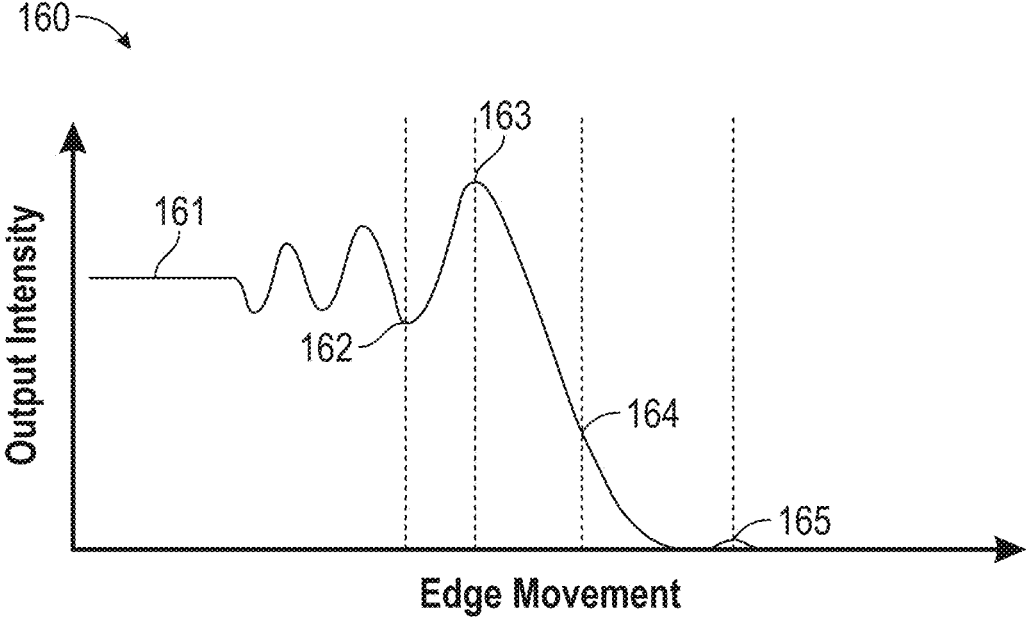
FIG. 4 is an interferogram illustrating output intensity as a function of edge movement.
Figure 5:
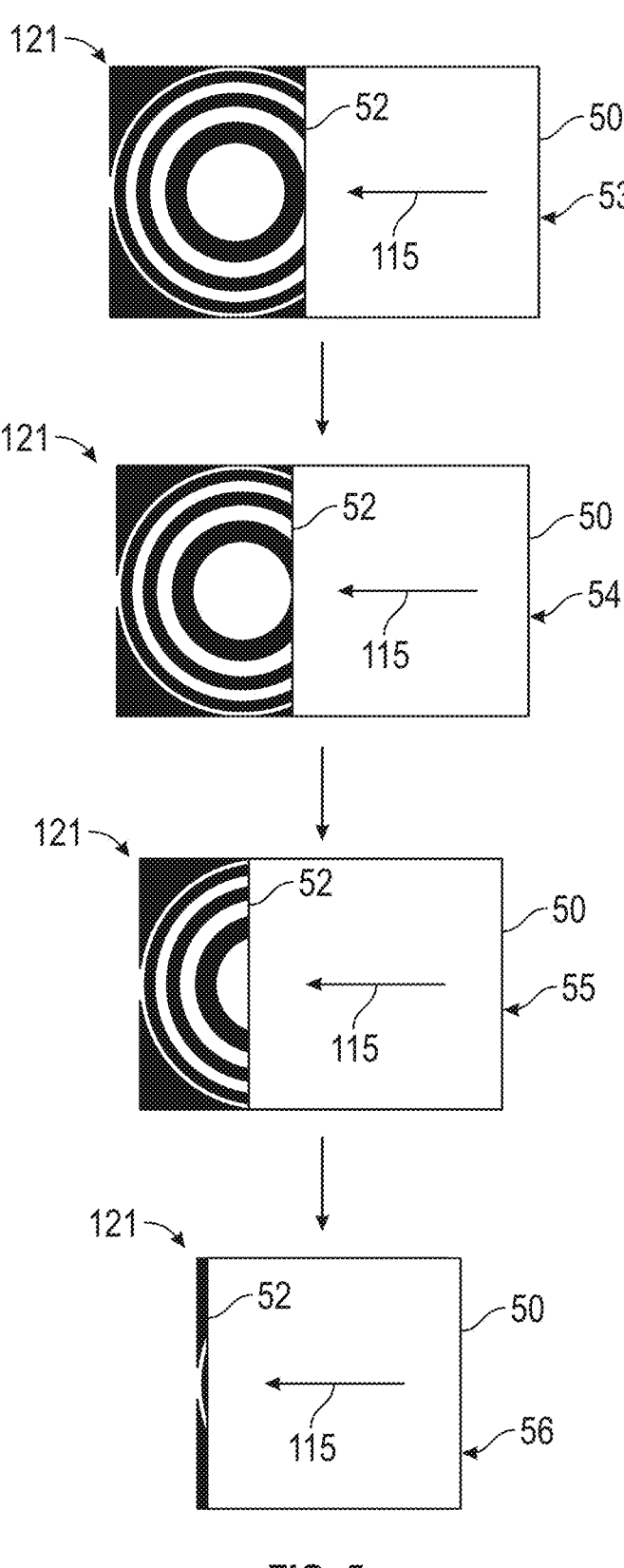
FIG. 5 is a schematic view of an obstruction occluding the interferometric fringe pattern of FIG. 3.

As an example, the distance between the objective lens focal point and the pattern 11 of photomask 10 is indicated by numeral 131 in FIG. 2. Referring still to FIGS. 3-5, FIG. 4 illustrates a interferogram 160 of output intensity 161 of a simulated interferometric fringe pattern 121 as a function of the position of an edge 52 of an obstruction 50 (e.g., a photomask), where an ideal sharp edge 52 has a LER equal to zero (perfectly smooth). Particularly, in this example, the obstruction 50 (shown in FIG. 5) is slid across the simulated interferometric fringe pattern 121 to produce the output intensity 161 shown in interferogram 160. Output intensity 161 includes a plurality of peaks and corresponding troughs associated with the sharp edge 52 of obstruction 50 passing across the different high intensity regions 122, 124, 126, and 128, and low intensity regions 123, 125, and 127 of the simulated interferometric fringe pattern 121 used to produce interferogram 160. For example, a first trough 162 of output intensity 161 corresponds to a first position 53 of the obstruction 50 shown in FIG. 5, while a peak 163 of output intensity 161 corresponds to a second position 54 of the obstruction 50 that is spaced from the first position 53 along the primary motion axis 115. It may be noted that the trough 162 of output intensity 161 corresponds to the sharp edge 52 of obstruction 50 aligning with a radially outer edge of low intensity region 123 while peak 163 corresponds to the sharp edge 52 of obstruction 50 aligning with a radially outer edge of high intensity region 122.

Continuing with this example, as the obstruction 50 gradually occludes high intensity region 122 as the obstruction 50 passes from the second position 54 to a third position 55, the output intensity 161 gradually declines from the peak 163 towards zero, generating a final peak 165 as the sharp edge 52 of obstruction 50 enters into alignment with a radially inner edge of high intensity region 128 when obstruction 50 enters a fourth position 56. Interferogram 160 illustrates the plurality of peaks and corresponding troughs in output intensity 161 which may be obtained from the interferometric fringe pattern 121 in response to the movement of an obstruction 50 having the ideal sharp edge 52 across the interferometric fringe pattern 121. The plurality of peaks and corresponding valleys of the output intensity 161 shown in interferogram 160 may conveniently act as points of comparison with respect to the output intensity obtained when an obstruction (e.g., a patterned photomask) having one or more edges with some degree of roughness (e.g., LER>0) is transported across the interferometric fringe pattern 121. To state in other words, the output intensity 161 shown in interferogram 160 may, in some embodiments, used as a baseline for comparison with other obtained output intensities produced from patterned photomasks in order to determine one or more geometric parameters of the patterned photomasks, with the peaks and valleys of output intensity providing convenient data points for the comparison.

Figures 6, 7:
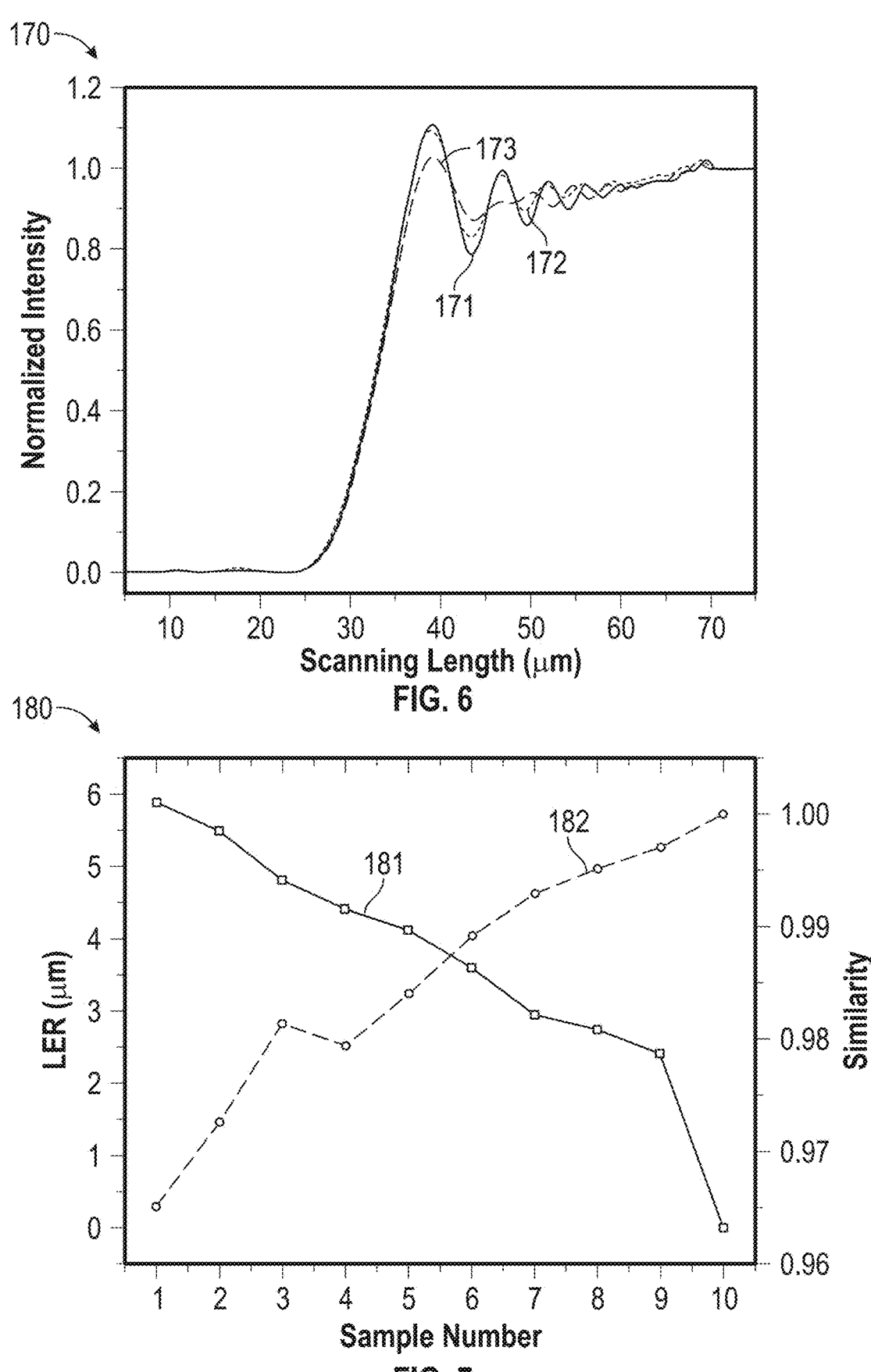
FIG. 6 is an interferogram illustrating normalized output intensity as a function of scanning length.
FIG. 7 is a graph relating line edge roughness (LER) and the similarity score for a plurality of sample obstructions.

Referring now to FIGS. 6 and 7, another interferogram 170 is shown in FIG. 6, and a graph 180 is shown in FIG. 7. Particularly, interferogram 170 includes a first or ideal output intensity 171 produced by transporting a first obstruction having an ideal sharp edge across the interferometric fringe pattern 121 producible by photomask inspection system 100. Additionally, interferogram 170 includes a second output intensity 172 produced by transporting a second obstruction across interferometric fringe pattern 121 having an edge with a non-zero first LER, and a third output intensity 173 produced by transporting a third obstruction across interferometric fringe pattern 121 having an edge with a non-zero second LER that is greater (rougher or less sharp) than the first LER. In this example, the first LER is equal to approximately 2.4 micrometers (μm) while the second LER is equal to approximately 5.9 μm.

It may be noted from interferogram 170 that output intensities 172 and 173 follow a similar pattern as first output intensity 171 in response to the edges of the different obstructions travelling across the different high intensity regions 122, 124, 126, and 128 and low intensity regions 123, 125, and 127 of interferometric fringe pattern 121. However, output intensities 172 and 173 demonstrate a greater degree of attenuation than first output intensity 171, with second output intensity 173 having even greater attenuation than second output intensity 172. To state in other words, first output intensity 171 has relatively more pronounced peaks and corresponding troughs compared with second output intensity 172, while second output intensity 172 has relatively more pronounced peaks and corresponding troughs compared with third output intensity 173. Given that the roughness of the edge of the obstruction used to produce the given output intensity 171, 172, and 173 is positively correlated with the relative attenuation of the given output intensity, the degree of roughness (as well as other geometric parameters) of the edge of a given obstruction may be estimated based on the difference between the output intensity produced from transporting the given obstruction across interferometric fringe pattern 121 with the output intensity produced by an obstruction having an ideal sharp edge.

As an example, graph 180 of FIG. 7 plots the LER 181 of ten different sample obstructions transportable across interferometric fringe pattern 121, where the tenth sample obstruction (identified as sample "10" along the X-axis of graph 180) has an ideal sharp edge with an LER equal to zero. Additionally, graph 180 plots a plurality of similarity scores 182 relating the similarity from the output intensity obtained from transporting each sample obstruction across the interferometric fringe pattern 121 to the output intensity obtained from the ideal sharp sample (sample 10 in this example). In this example, similarity scores 182 are obtained by cross-correlating the output intensity obtained from the ideal sharp sample (the reference sample in this comparison) with the output intensities obtained from the other sample obstructions; however, it may be understood that in other embodiments other methodologies may be utilizes to compare the different output intensities. In this manner, the LER plot 181 and similarity score plot 182 can be used to estimate the LER of other sample obstructions (e.g., patterned photomasks having rough edges) to estimate their respective LER. It may be further understood that similar techniques (e.g., cross-correlation analysis) may be used to identify geometric parameters other than LER, such as the presence and magnitude of defects in a patterned photomask.

Referring again to FIGS. 1-3, it may be understood that the controller 150 of photomask inspection system 100 may generate one or more interferograms in response to transporting one or more corresponding obstructions (e.g., photomask 10) across the interferometric fringe pattern 121 generated by system 100. Additionally, controller 150 may compare the output intensity produced by transporting a given obstruction across the interferometric fringe pattern 121 with a simulated output intensity (e.g., determined from a Fresnel number-based computation model) from an ideal sample or pattern. For example, controller 150 may simulate the output intensity produced from the ideal or intended pattern 11 of photomask 10, and compare the simulated output intensity with the actual output intensity obtained from transporting the photomask 10 across the interferometric fringe pattern 121. In some embodiments, controller 150 may perform a cross-correlation analysis of the different output intensities or interferograms produced by system 100 to determine or detect one or more geometric parameters of the pattern 11 of photomask 10 such as the LER of one or more edges of the pattern 11. However, in other embodiments, controller 150 may employ other comparison techniques for determining the one or more geometric parameters of the pattern 11 of photomask 10.

Figure 8:
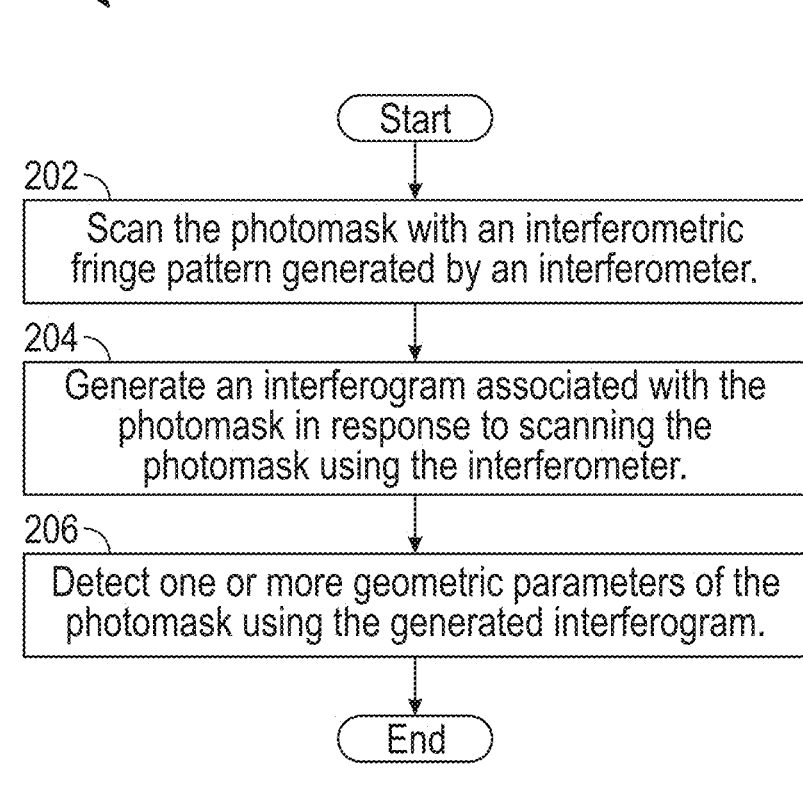
FIG. 8 is a flowchart of an embodiment of a method for inspecting a photomask.

Referring now to FIG. 8, an embodiment of a method 200 for inspecting photomasks is shown. In this exemplary embodiment, method 200 begins at block 202 by scanning the photomask with an interferometric fringe pattern generated by an interferometer. In some embodiments, block 202 includes shaping a collimated beam using an objective lens of the interferometer to focus an incident beam on a focal point. In certain embodiments, block 202 comprises scanning the photomask 10 (shown in FIGS. 1 and 2) with the interferometric fringe pattern 121 (shown in FIG. 3) generated by the interferometer 140 (shown in FIGS. 1 and 2) of the photomask inspection system 100 (shown in FIG. 1).

At block 204, method 200 includes generating an interferogram associated with the photomask in response to scanning the photomask using the interferometer. In this context, "in response to" does not necessarily mean automatically following the scanning of the photomask using the interferometer. In some embodiments, block 204 includes superpositioning a reference incident spherical wave (e.g. spherical waveform 109 and an edge-diffracted wave as the photomask is scanned whereby interference between the spherical wave and the edge-diffracted wave produces an interferometric fringe pattern. In certain embodiments, block 204 comprises generating an interferogram associated with the photomask 10 (shown in FIGS. 1 and 2) in response to scanning the photomask using the interferometer (shown in FIGS. 1 and 2).

At block 206, method 200 includes detecting one or more geometric parameters of the photomask using the generated interferogram. In some embodiments, block 206 includes comparing the generated interferogram with a reference interferogram. In some embodiments, the generated interferogram is associated with a fabricated pattern of the photomask, and the reference interferogram is associated with an intended pattern of the photomask. In some embodiments, block 206 includes performing at least one of a fringe analysis method and a wavelet-based feature extraction method on the interferogram. In certain embodiments, block 206 includes performing one or more of a cross-correlation analysis, a logarithm decrement analysis, a wavelet transform analysis, and computer vision or image training analysis using a machine learning algorithm. Experiments were conducted for estimating one or more geometric parameters of photomasks utilizing EKEI. It may be understood that the following experiments described herein are not intended to limit the scope of this disclosure and the embodiments described above and shown in FIGS. 1-8. Particularly, in an experimental study, a collimated laser (wavelength of approximately 532 nanometers (nm)) passed through an aperture ($\phi$1.0 millimeters (mm)) and was beam-shaped by an objective lens (NA of 0.4). The beam-shaped laser passed through a sample photomask and the diffraction interferometric fringe pattern was recorded by the photodetector (PD) sensor. In this study, the beam diameter on the photomask surface was approximately 100 µm.

Additionally, a photomask with nine groups of line patterns containing different characterized LER was tested during this study. The photomask was securely fixed on an XY motorized scanning stage, and the scanning speed was set to approximately 1 millimeter per second (mm/s). By scanning different areas on the photomask, the interferometric fringe patterns created from different LER decorated lines were recorded. Particularly, in this study, the signal was recorded by an optical fiber-pigtailed photodiode and a lock-in amplifier was used for signal processing. While all datasets from the photomask were recorded, the photomask was used for lithography to make a lift-off replica wafer with the chromium (Cr) coating layer.

Figure 9:
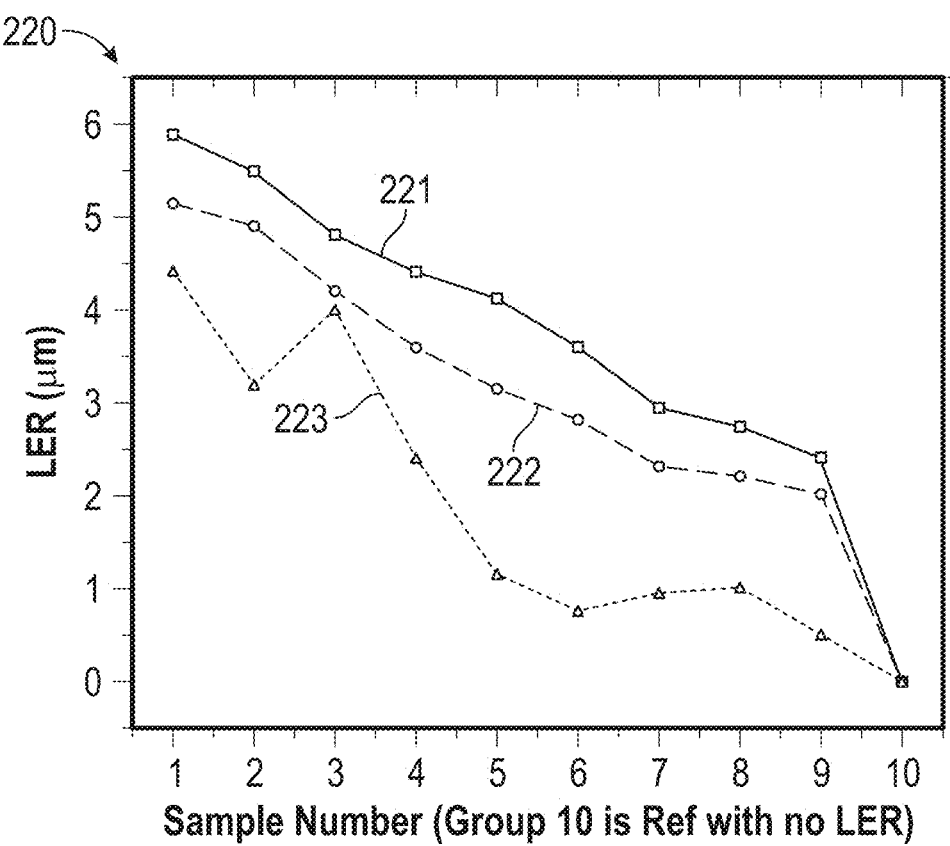
FIG. 9 is a graph illustrating the LER of different sample photomasks.
Figure 10:
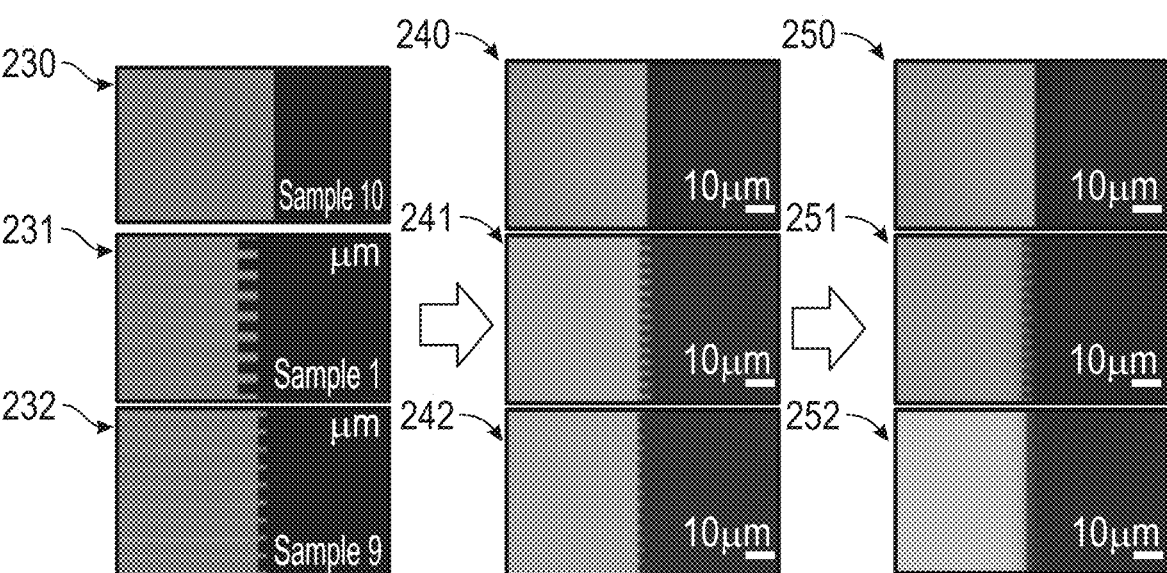
FIG. 10 is a series of images of some of the different sample photomasks of FIG. 9.

After the lithography process, both the photomask and the replica wafer patterns were measured by optical microscopy. Referring to FIGS. 9 and 10, a graph 220 is shown in FIG. 9 indicating the LER values for intended or designed patterns (indicated by 221 in graph 220), fabricated photomasks (indicated by 222 in graph 220), and of the replica wave (indicated by 223 in graph 220) of ten different samples from this study. It may be understood that the LER values 221 for the designed patterns were simulated using a model. Additionally, FIG. 10 illustrates images of the patterns for samples 1, 9, and 10 shown in graph 220 of FIG. 9. Particularly, FIG. 10 illustrates images of the intended or designed patterns for samples 1 (image 230), 9 (image 231) and 10 (image 232), images of the fabricated photomasks for samples 1 (image 240), 9 (image 241), and 10 (image 242), and images of the respective replica wafers for samples 1 (image 250), 9 (image 251), and 10 (image 252).

The LER values for the photomask (LER values 222) and wafer (LER values 223) in graph 220 were calculated by analyzing images from a microscope. From graph 220, generally, the LER values 221-223 decrease as the group or sample number increases for both photomask and replica wafers. However, there were still some differences between the designed and fabricated photomasks. First, although the fabricated photomask maintained the designed LER pattern from FIG. 10, there was still approximately a 1 μm LER deviation compared with the designed and fabricated photomask LER values 221 and 222, respectively, which may have been caused by the resolution of the images (e.g., images 230-232 and images 240-242). Particularly, in those respective images, 10 μm implied 34-pixel points. In that circumstance, it was difficult to define the position of the edge precisely due to the diffraction when obtaining the images. A 1 um of LER deviation indicated an approximately 0.33 μm difference in standard deviation, which was just a 1-pixel variance, which might be the reason for the LER deviation between the designed and fabricated photomasks.

Additionally, there was also deviations between the fabricated photomask LER values 222 and the wafer LER values 223. For that issue, one of the reasons may have been the resolution of the images (e.g., images 240-242 for the fabricated photomask and images 250-252 for the wafers), and the other may have been the result of the lithography process. In this study, the replica wafer was fabricated by lift-off processing. During the manufacturing process, there were many uncertainties that might have caused imperfection in duplication due to, for example, diffraction, scattering, photoresist, or catalyst during the lithography. Last, the replica wafer was scanned by an experimental EKEI system (e.g., a system similar in configuration in at least some respects to inspection system 100 shown in FIGS. 1 and 2) to record the interferometric fringe patterns in comparison with those of the photomask patterns.

Figures 11, 12:
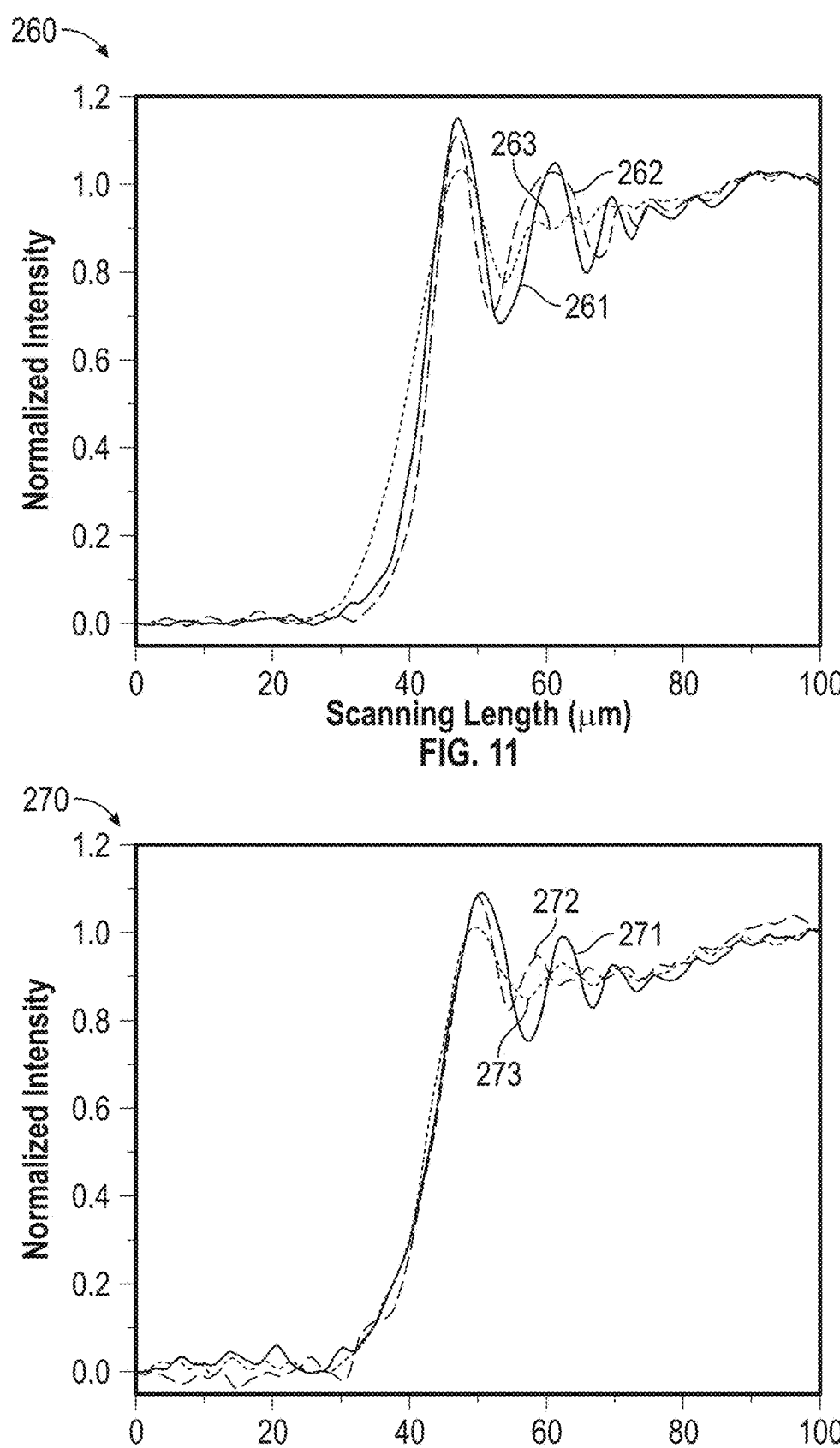
FIGS. 11 and 12 are interferograms illustrating normalized output intensity as a function of scanning length.

Specifically, the experimental EKEI system scanned the photomask and its replica wafer. As mentioned above, on the fabricated photomask, there were 9-line patterns with different LER values, and the LER was defined by the intensity and duty cycle for the rectangular function on the edge. From sample 1 to sample 9, the LER value decreased from approximately 5.88 μm to approximately 2.40 μm. Additionally, sample 10 was designed as a control or reference group with no LER (ideal sharp edge) for comparison. Referring to FIGS. 11 and 12, interferograms 260 and 270 are shown, respectively. Particularly, interferogram 260 illustrates normalized output intensity 261, 262, and 263 for three selected fabricated photomasks while interferogram 270 illustrates normalized output intensity 271, 272, and 273 for three selected photomasks. In this example, output intensity 261 and output intensity 271 correspond to the reference sample having zero LER, output intensity 262 and output intensity 272 correspond to a pattern having an LER equal to approximately 2.40 μm, and output intensity 263 and output intensity 273 correspond to a pattern having an LER equal to approximately 5.88 μm. The 2.40 μm LER and 5.88 ∞m LER implies the lowest and the highest LER value in this study.

Based on the output intensities 261-263 of interferogram 260, the fringes generally were attenuated when the LER value increases. When the LER changes from smooth (LER=0) to LER=5.88 μm, the intensity of the first order fringe decreased from 1.147 to 1.028. Not only does the amplitude of the first-order fringe decrease, but the higher-order fringes were also attenuated or vanished when the LER value increased. In interferogram 260, compared with the 5 orders of fringes from the smooth case, when the LER increased to 5.88 μm, only the first and the second order of fringes can be distinguished, and all higher order fringes vanished.

Interferogram 270 shows the scanning result from the replica wafer. Comparing interferograms 260 and 270, the fringes generated by the replica wafer maintained the same trend of attenuation as the fringes from the photomask. Additionally, the trend of the interferometric fringe pattern agreed with the simulation results indicated in graph 220 of FIG. 9. Overall, the experimental approaches indicated the following results: (1) the LER can be printed on the photomask and can be replicated to the wafer by photolithography; and (2) the fringes from edge diffraction attenuate when the LER value of the edge increases. In this study, the similarity decreased by approximately 0.017 when the LER value increased from 2.40 μm to 5.88 μm. Generally, because of the attenuation, the intensity for the first-order fringe decreased and some higher-order fringes vanished.

Figure 13:
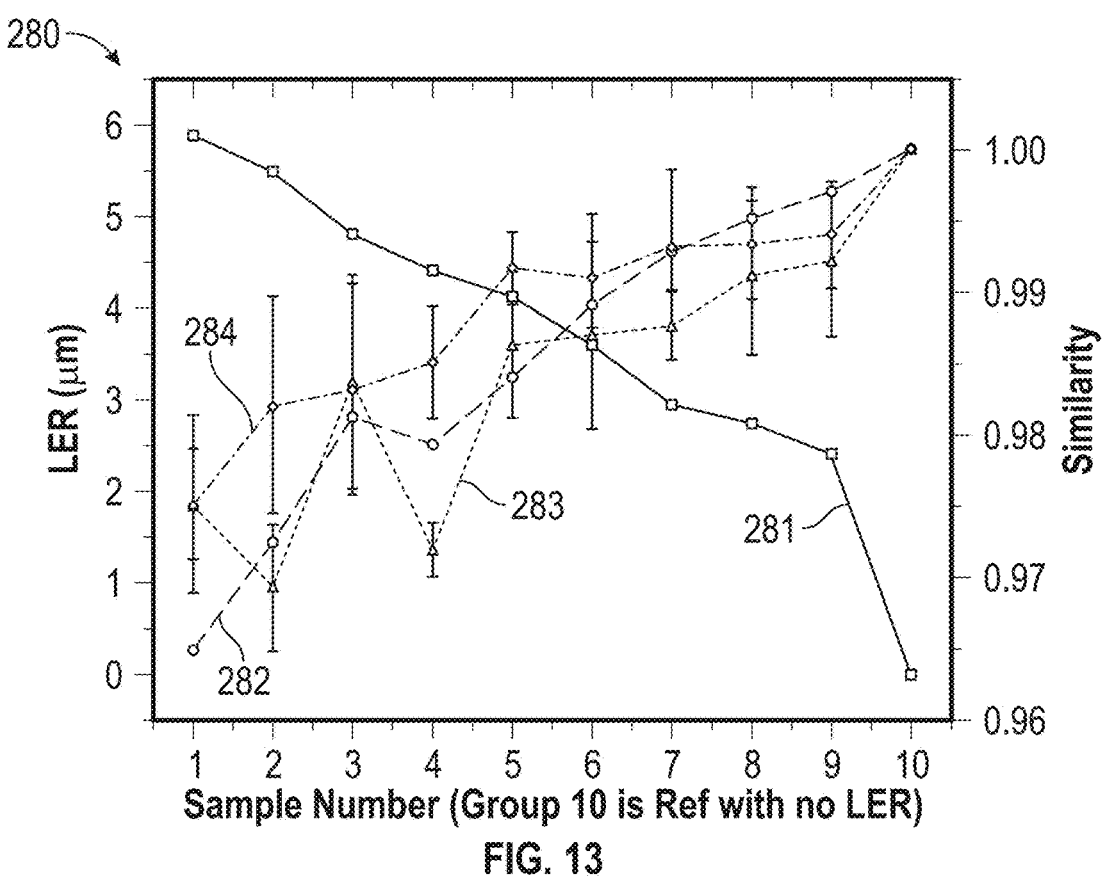
FIG. 13 is a graph relating LER and the similarity score for a plurality of sample photomasks.
Figure 14:
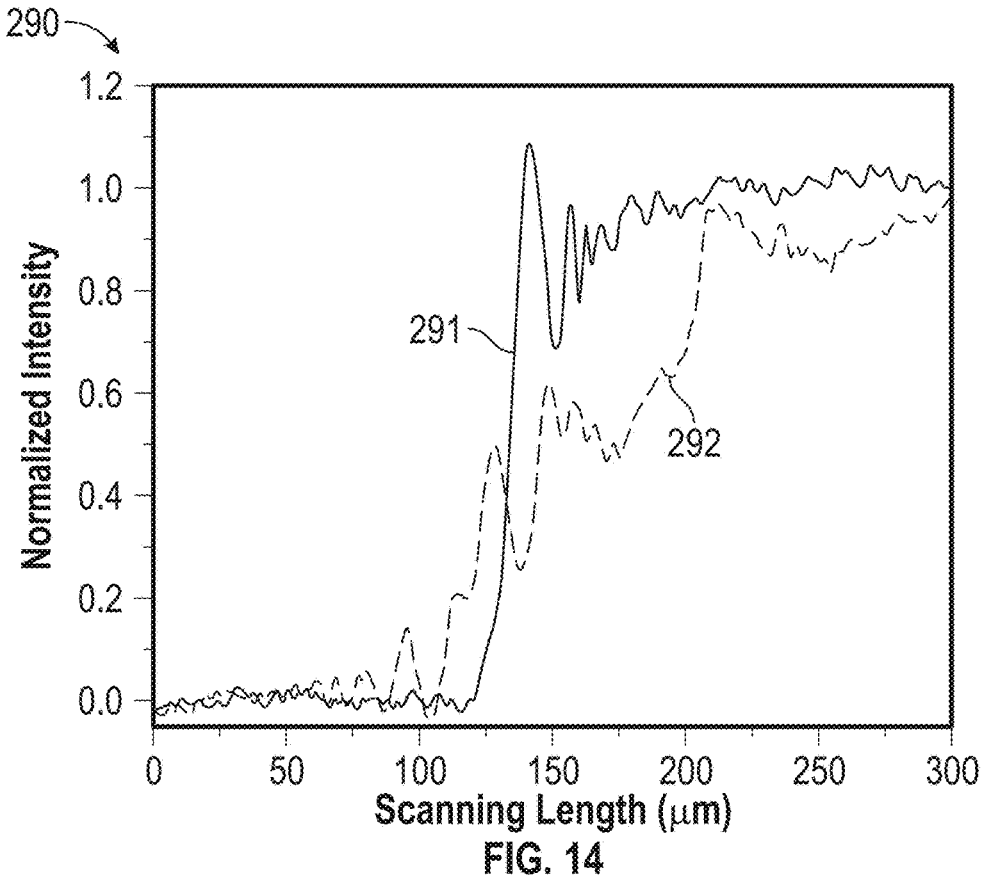
FIG. 14 is an interferogram illustrating normalized output intensity as a function of scanning length.

As part of this study, after collecting the interferometric fringe patterns from the photomask edge patterns under different LER conditions, the cross-correlation-based similarity values were obtained to numerically express the features that represent a change in the fringes. Referring to FIGS. 13 and 14, the analysis results from the cross-correlation method are presented in a graph 280 shown in FIG. 13. Particularly, graph indicates LER values 281 along with similarity scores 282, 283, and 284 for the intended (simulated) pattern, the fabricated photomask, and the wafer, respectively. This result indicated that the similarity score increased while the LER decreased. Based on the similarity results from photomask interferometric fringe patterns, the similarity decreased by 0.0183 when the LER value changed from 2.40 μm to 5.88 μm. Although the basic dimension of the characterized rectangular function followed the LER pattern design (intensity and duty cycle), there were still some deviations from the intended pattern and the pattern of the fabricated photomask, which caused the difference in the variation of similarities. Additionally, the diffraction and the imperfection of the lift-off replica wafer induced the error between the replica wafer and the fabricated photomask, which caused the deviation of the similarity values as well.

Overall, these results indicate the experimental EKEI system can track and characterize the LER based on the changes in similarity values, where the similarity has a negative correlation with the LER value.

FIG. 14 includes an interferogram 290 illustrating normalized output intensities 291 and 292 for both a normal edge and an abnormal edge, respectively. Particularly, interferogram 290 shows the interferometric fringe pattern changes in case there is a residue on the photomask after the lithography process. Compared with the fringes from the smooth edge, the fringe from an abnormal (residue-contaminated) edge shows different features. First, the boundary of the abnormal edge becomes fuzzy. In a conventional coated pattern, the light intensity increases dramatically when the incident light is not blocked by the opaque pattern, which follows the trend in FIG. 14, normal edge (output intensity 291), from 100 μm to 200 μm. However, the boundary for a residue-contaminated edge did not follow that feature. In FIG. 14, the abnormal edge (output intensity 292), from 100 μm to 250 μm, shows that the normalized intensity increased gradually. The abnormal edge did not block the light 100 percent, where the light was permitted to partially pass through the edge and its contaminated area. Second, the interferometric fringe pattern vanished in fringes from the abnormal edge, which may have been due to the difference in the light interference. Based on the Huygens-wavelet theory, the incoming light source and the Huygens wavelets emitted on the edge generated the edge diffraction pattern. However, when the edge changes to an abnormal edge, not only is there present the incoming light source and Huygens wavelets from the edge, but also the light that is modulated by that residue-contaminated area. This third wave source can change the interferometric fringe pattern from the conventional edge diffraction. Based on the results from FIG. 14, the experimental EKEI system could also track the variance of the fringes when the residue photoresist damaged or contaminated the photomask. In that case, the experimental EKEI system may be effective for an in-situ photomask monitoring system to track the status of the photomask in industries. Specifically, the EKEI system could track and report those residues directly in the semiconductor manufacturing process.

This study indicated the experimental EKEI system for LER characterization. Particularly, the Fresnel number-based geometrical EKEI model with LER characterization was developed. The EKEI model simulated interferometric fringe patterns concerning different LER conditions. The LER of the pattern was characterized by using rectangular functions in different duty cycles and intensities. The simulation results indicated that the increase in the LER value result in attenuation of the interferometric fringe pattern. In addition, the cross-correlation method analyzed the generated interferometric fringe patterns. As a result, the similarity value decreased as the LER increased. The cross-correlation method also implemented this analytical method in experimental data analysis. From the study, LER-characterized photomask patterns and lithography-printed patterns recorded the fringes. The computation model indicated agreement with the experimental results obtained from the cross-correlation analysis method. As a result, the experimental EKEI system successfully characterized the LER on both the photomask patterns and the printed patterns. Successful integration of the proposed inspection system sheds light not only on the LER characterization but also on photomask defectivity metrology and inspection, improving the lithography processes and increasing yield.

While embodiments of the disclosure have been shown and described, modifications thereof can be made by one skilled in the art without departing from the scope or teachings herein. The embodiments described herein are exemplary only and are not limiting. Many variations and modifications of the systems, apparatus, and processes described herein are possible and are within the scope of the disclosure. For example, the relative dimensions of various parts, the materials from which the various parts are made, and other parameters can be varied. Accordingly, the scope of protection is not limited to the embodiments described herein, but is only limited by the claims that follow, the scope of which shall include all equivalents of the subject matter of the claims. Unless expressly stated otherwise, the steps in a method claim may be performed in any order. The recitation of identifiers such as (a), (b), (c) or (1), (2), (3) before steps in a method claim are not intended to and do not specify a particular order to the steps, but rather are used to simplify subsequent reference to such steps.

While embodiments of the disclosure have been shown and described, modifications thereof can be made by one skilled in the art without departing from the scope or teachings herein. The embodiments described herein are exemplary only and are not limiting. Many variations and modifications of the systems, apparatus, and processes described herein are possible and are within the scope of the disclosure. For example, the relative dimensions of various parts, the materials from which the various parts are made, and other parameters can be varied. Accordingly, the scope of protection is not limited to the embodiments described herein, but is only limited by the claims that follow, the scope of which shall include all equivalents of the subject matter of the claims. Unless expressly stated otherwise, the steps in a method claim may be performed in any order. The recitation of identifiers such as (a), (b), (c) or (1), (2), (3) before steps in a method claim are not intended to and do not specify a particular order to the steps, but rather are used to simplify subsequent reference to such steps.

What is claimed is:

1. A method for inspecting a photomask, the method comprising:

(a) scanning the photomask as the photomask travels along a motion axis with an interferometric fringe pattern generated by an interferometer and projected along a beam axis of the interferometer extending orthogonal the motion axis whereby the interferometric fringe pattern passes partially through the photomask along the beam axis as one or more edges of the photomask partially occludes the passage of the interferometric fringe pattern therethrough, the interferometric fringe pattern comprising an alternating plurality of annular high intensity regions and annular low intensity regions;

(b) generating an interferogram associated with the one or more edges of the photomask in response to scanning the photomask using the interferometer; and (c) detecting one or more geometric parameters of the one or more edges of the photomask using the generated interferogram.

2. The method of claim 1, wherein (c) comprises:

(c1) comparing the generated interferogram with a reference interferogram.

3. The method of claim 2, wherein the generated interferogram is associated with a fabricated pattern of the photomask defined at least partially by the one or more edges, and the reference interferogram is associated with an intended pattern of the photomask.

4. The method of claim 2, wherein (c1) comprises performing a cross-correlation analysis between the generated interferogram and the reference interferogram.

5. The method of claim 1, wherein (a) comprises:

(a1) shaping a collimated beam using an objective lens of the interferometer to focus an incident beam on a focal point.

6. The method of claim 1, wherein (b) comprises:

(b1) superpositioning a reference incident spherical wave and an edge-diffracted wave.

7. The method of claim 1, wherein the one or more geometric parameters comprise at least one of a pattern width, an opening area width, a line-edge quality, and an opening area surface quality of the photomask.

8. The method of claim 1, wherein (c) comprises:

(c1) performing at least one of fringe analysis method and a wavelet-based feature extraction method on the interferogram.

9. A system for inspecting a photomask, the system comprising:

an interferometer comprising a laser configured to generate a beam and a photodetector configured to detect the beam generated by the laser, the interferometer configured to generate an interferometric fringe pattern projected along a beam axis of the interferometer and to scan the photomask with the interferometric fringe pattern as the photomask travels along a motion axis extending orthogonal the beam axis whereby the interferometric fringe pattern passes partially through the photomask along the beam axis as one or more edges of the photomask partially occludes the passage of the interferometric fringe pattern therethrough, the interferometric fringe pattern comprising an alternating plurality of annular high intensity regions and annular low intensity regions; and a computer system in signal communication with the interferometer, the computer system configured to generate an interferogram associated with the one or more edges of the photomask based on data provided by the photodetector, and to detect one or more geometric parameters of the one or more edges of the photomask using the generated interferogram.

10. The system of claim 9, wherein the interferometer comprises an objective lens positioned between the laser and the photodetector along the beam axis of the interferometer.

11. The system of claim 9, further comprising a motion stage coupled to the interferometer, the motion stage comprising an actuator configured to transport the photomask along the motion axis.

12. The system of claim 11, wherein the motion axis comprises a first motion axis and the actuator is configured to transport the photomask along a second motion axis extending orthogonal to the first motion axis.

13. The system of claim 9, wherein the computer system is configured to compare the generated interferogram with a reference interferogram.

14. The system of claim 13, wherein the generated interferogram is associated with a fabricated pattern of the photomask at least partially defined by the one or more edges, and the reference interferogram is associated with an intended pattern of the photomask.

15. The system of claim 9, wherein the one or more geometric parameters comprise at least one of a pattern width, an opening area width, a line-edge quality, and an opening area surface quality of the photomask.

16. A computer system for inspecting a photomask, the computer system comprising:

a processor; and a storage device coupled to the processor and containing instructions that when executed cause the processor to:

scan the photomask with an interferometric fringe pattern as the photomask travels along a motion axis, the interferometric fringe pattern generated by an interferometer and projected along a beam axis of the interferometer that extends orthogonal the motion axis whereby the interferometric fringe pattern passes partially through the photomask along the beam axis as one or more edges of the photomask partially occludes the passage of the interferometric fringe pattern therethrough, the interferometric fringe pattern comprising an alternating plurality of angular high intensity regions and annular low intensity regions;

generate an interferogram associated with the one or more edges of the photomask in response to scanning the photomask using the interferometer; and detect one or more geometric parameters of the one or more edges of the photomask using the generated interferogram.

17. The computer system of claim 16, wherein the instructions when executed cause the processor to:

compare the generated interferogram with a reference interferogram.

18. The computer system of claim 17, wherein the generated interferogram is associated with a fabricated pattern of the photomask that is at least partially defined by the one or more edges, and the reference interferogram is associated with an intended pattern of the photomask.

19. The computer system of claim 16, wherein the instructions when executed cause the processor to:

perform a cross-correlation analysis between the generated interferogram and a reference interferogram.

20. The computer system of claim 16, wherein the one or more geometric parameters comprise at least one of a pattern width, an opening area width, a line-edge quality, and an opening area surface quality of the photomask.

* * * * *